United States Patent
Guo et al.

(10) Patent No.: US 10,211,261 B2
(45) Date of Patent: Feb. 19, 2019

(54) PIXEL STRUCTURE, MASK PLATE, ORGANIC ELECTROLUMINESCENT DISPLAY PANEL AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Kun Guo, Beijing (CN); Yanqing Wang, Beijing (CN); Bo Zhang, Beijing (CN); Fei Chen, Beijing (CN); Jianbin Feng, Beijing (CN); Fan Yang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

(*) Notice: Subject to any disclaimer, the term of this patent is extended or adjusted under 35 U.S.C. 154(b) by 0 days.

(21) Appl. No.: 15/320,703

(22) PCT Filed: Mar. 25, 2016

(86) PCT No.: PCT/CN2016/077322
§ 371 (c)(1),
(2) Date: Dec. 20, 2016

(87) PCT Pub. No.: WO2016/169387
PCT Pub. Date: Oct. 27, 2016

(65) Prior Publication Data
US 2017/0194389 A1   Jul. 6, 2017

(30) Foreign Application Priority Data

Apr. 21, 2015 (CN) .......................... 2015 1 0191226

(51) Int. Cl.
*H01L 27/32* (2006.01)
*H01L 51/00* (2006.01)
(Continued)

(52) U.S. Cl.
CPC ...... *H01L 27/3213* (2013.01); *H01L 27/3218* (2013.01); *H01L 51/0011* (2013.01); *H01L 51/56* (2013.01); *H01L 51/5012* (2013.01)

(58) Field of Classification Search
None
See application file for complete search history.

(56) References Cited

U.S. PATENT DOCUMENTS

2006/0028495 A1*  2/2006  Phan ................... G09G 3/2003
                                                345/694
2008/0316235 A1* 12/2008  Okazaki ............ G02F 1/133514
                                                345/694
(Continued)

FOREIGN PATENT DOCUMENTS

CN          1549240 A       11/2004
CN          1549240 A       11/2004
(Continued)

OTHER PUBLICATIONS

Chen et al., CN 102830452 A (English—machine translation), Dec. 2012.*
(Continued)

*Primary Examiner* — Lex Malsawma
(74) *Attorney, Agent, or Firm* — Womble Bond Dickinson (US) LLP

(57) ABSTRACT

Embodiments of the present disclosure disclose a pixel structure, a mask plate, an organic electroluminescent display panel and a display device. The pixel structure comprises: a plurality of pixel units arranged in array, each pixel unit comprising four sub-pixels arranged diagonally and having the same shape and size; wherein colors of the four
(Continued)

sub-pixels in each pixel unit are different from each other; colors of two adjacent sub-pixels in any two adjacent pixel units are same. The above pixel structure provided by embodiments of the present disclosure may enable the color of any sub-pixel in a pixel unit to be same as the colors of three sub-pixels that are located in other three pixel units adjacent to this pixel unit respectively and are symmetric with this sub-pixel relative to a same point.

20 Claims, 9 Drawing Sheets

(51) Int. Cl.
    *H01L 51/56*     (2006.01)
    *H01L 51/50*     (2006.01)

(56) References Cited

U.S. PATENT DOCUMENTS

2009/0141381 A1*   6/2009   Itou .................. G02B 5/201
                                                                                                             359/891

2010/0141812 A1*   6/2010   Hirota .................. H04N 9/045
                                                                                                        348/279
2012/0092237 A1    4/2012   Phan

FOREIGN PATENT DOCUMENTS

| | | |
|---|---|---|
| CN | 102830452 A | 12/2012 |
| CN | 102830452 A | 12/2012 |
| CN | 103872091 A | 6/2014 |
| CN | 104916661 A | 9/2015 |

OTHER PUBLICATIONS

International Search Report with English language Translation dated Jun. 29, 2016, PCT Application No. PCT/CN2016/077322.
Office Action in Chinese Application No. 201510191226.9 dated May 26, 2017, with English translation.
"Second office action," CN Application No. 201510191226.9 (dated Jan. 12, 2018).

* cited by examiner

| R | G | B | R | G | B | R | G | B |
|---|---|---|---|---|---|---|---|---|
| R | G | B | R | G | B | R | G | B |
| R | G | B | R | G | B | R | G | B |
| R | G | B | R | G | B | R | G | B |

Fig. 1

| B | B | W | W | B | B | G | G | B | B |
|---|---|---|---|---|---|---|---|---|---|
| B | B | W | W | B | B | G | G | B | B |
| R | R | G | G | R | R | W | W | R | R |
| R | R | G | G | R | R | W | W | R | R |
| B | B | W | W | B | B | G | G | B | B |
| B | B | W | W | B | B | G | G | B | B |
| R | R | G | G | R | R | W | W | R | R |
| R | R | G | G | R | R | W | W | R | R |
| B | B | W | W | B | B | G | G | B | B |
| B | B | W | W | B | B | G | G | B | B |

Fig. 2a

| B | B | W | W | B | B | W | W | B | B |
|---|---|---|---|---|---|---|---|---|---|
| B | B | W | W | B | B | W | W | B | B |
| R | R | G | G | R | R | G | G | R | R |
| R | R | G | G | R | R | G | G | R | R |
| B | B | W | W | B | B | W | W | B | B |
| B | B | W | W | B | B | W | W | B | B |
| R | R | G | G | R | R | G | G | R | R |
| R | R | G | G | R | R | G | G | R | R |
| B | B | W | W | B | B | W | W | B | B |
| B | B | W | W | B | B | W | W | B | B |

| B | B | W | W | B | B | G | G | B | B |
|---|---|---|---|---|---|---|---|---|---|
| B | B | W | W | B | B | G | G | B | B |
| R | R | G | G | R | R | W | W | R | R |
| R | R | G | G | R | R | W | W | R | R |
| B | B | W | W | B | B | G | G | B | B |
| B | B | W | W | B | B | G | G | B | B |
| R | R | G | G | R | R | W | W | R | R |
| R | R | G | G | R | R | W | W | R | R |
| B | B | W | W | B | B | G | G | B | B |
| B | B | W | W | B | B | G | G | B | B |

Fig. 5a

| B | B | W | W | B | B | G | G | B | B |
|---|---|---|---|---|---|---|---|---|---|
| B | B | W | W | B | B | G | G | B | B |
| R | R | G | G | R | R | W | W | R | R |
| R | R | G | G | R | R | W | W | R | R |
| B | B | W | W | B | B | G | G | B | B |
| B | B | W | W | B | B | G | G | B | B |
| R | R | G | G | R | R | W | W | R | R |
| R | R | G | G | R | R | W | W | R | R |
| B | B | W | W | B | B | G | G | B | B |
| B | B | W | W | B | B | G | G | B | B |

PIXEL STRUCTURE, MASK PLATE, ORGANIC ELECTROLUMINESCENT DISPLAY PANEL AND DISPLAY DEVICE

TECHNICAL FIELD

The present disclosure relates to the field of display technology, particularly to a pixel structure, a mask plate, an organic electroluminescent display panel and a display device.

BACKGROUND

At present, the organic electroluminescent display (OLED) panel has become the main stream of the display field gradually by right of its excellent performance of low power consumption, high color saturation, wide visual angle, small thickness, and flexibility, and can be widely applied in terminal products such as smartphones, panel computers, televisions. The personal mobile products such as smartphones in the market recently have put forth higher and higher requirement on resolution to the display screen. The screen resolution (i.e., pixel density) has been up to 400 ppi, and will even exceed 500 ppi in future development trend, which forms a great challenge to the prior art of OLED.

The arrangement manner of the OLED light emitting pixels in the prior art generally uses RGB strip arrangement similar as LCD, i.e., the RGB sub-pixels are arranged in a juxtaposition manner, as shown in FIG. 1. In the process of manufacturing the light emitting layer of the OLED, the fine metal mask (FMM) technology is mainly used, i.e., when evaporating one organic light emitting material for RGB, shielding the other two corresponding sub-pixels by means of the shielding function of the shielding area of the mask plate, then, moving the mask plate or the base substrate by a fine alignment system to evaporate the other two organic light emitting materials successively. When the screen resolution is above 300 ppi, such an OLED light emitting pixels arrangement requires the opening and the connecting bridge of the mask plate used for evaporating the organic light emitting material to be very small, thus, not only the processing difficulty of the mask plate is very great, but also the factors such as the alignment accuracy of the mask plate, the shadow of the mask plate, the deformation of the mask plate will seriously affect evaporation of the organic light emitting materials for forming fine colored pixel patterns.

Therefore, how to reduce the processing accuracy and alignment accuracy of the mask plate while achieving a high resolution of the display panel is a technical problem that needs to be solved by the skilled person in the art urgently.

SUMMARY

In view of this, it is desired to provide a pixel structure, a mask plate, an organic electroluminescent display panel and a display device, which not only can reduce the processing difficulty of the mask plate evaporation opening and the manufacturing process requirement of the display panel, but also can increase resolution of the display panel.

Therefore, embodiments of the present disclosure provide a pixel structure, comprising a plurality of pixel units arranged in array, each pixel unit comprising four sub-pixels arranged diagonally and having the same shape and size. and colors of the four sub-pixels in each pixel unit are different from each other; colors of two adjacent sub-pixels in any two adjacent pixel units are same.

According to another embodiment, the four sub-pixels in each pixel unit are respectively a first sub-pixel of a first color, a second sub-pixel of a second color, a third sub-pixel of a third color, and a fourth sub-pixel of a fourth color. The first sub-pixel, the second sub-pixel, the third sub-pixel and the fourth sub-pixel are arranged in a clockwise direction or a counter-clockwise direction in one of the following arrangement manners:

the first sub-pixel, the second sub-pixel, the third sub-pixel and the fourth sub-pixel;

the first sub-pixel, the second sub-pixel, the fourth sub-pixel and the third sub-pixel;

the first sub-pixel, the third sub-pixel, the second sub-pixel and the fourth sub-pixel;

the first sub-pixel, the third sub-pixel, the fourth sub-pixel and the second sub-pixel;

the first sub-pixel, the fourth sub-pixel, the second sub-pixel and the third sub-pixel;

the first sub-pixel, the fourth sub-pixel, the third sub-pixel and the second sub-pixel.

According to another embodiment, each of the first color, the second color, the third color and the fourth color is a color selected from red, green, blue and white and the first color, the second color, the third color and the fourth color are different from each other.

According to another embodiment, the shape of the sub-pixel is one of square, rectangle and diamond.

Embodiments of the present disclosure further provide a mask plate, comprising: a mask plate body and a plurality of evaporation openings arranged on the mask plate body. The plurality of evaporation openings are in aligned arrangement and each evaporation opening corresponds to a pattern constituted by sub-pixels of the same color in the above pixel structure provided by embodiments of the present disclosure.

Embodiments of the present disclosure further provide a mask plate, comprising: a mask plate body and a plurality of evaporation openings arranged on the mask plate body. The plurality of evaporation openings are in staggered arrangement and each evaporation opening corresponds to a pattern constituted by sub-pixels of the same color in the above pixel structure provided by embodiments of the present disclosure.

Embodiments of the present disclosure further provide an organic electroluminescent display panel, comprising the above pixel structure provided by embodiments of the present disclosure.

Embodiments of the present disclosure further provide a display device, comprising the above organic electroluminescent display panel provided by embodiments of the present disclosure.

The embodiments of the present disclosure may achieve the following advantages.

In the pixel structure, the mask plate, the organic electroluminescent display panel and the display device provided by embodiments of the present disclosure, the pixel structure comprises: a plurality of pixel units arranged in array, each pixel unit comprising four sub-pixels arranged diagonally and having the same shape and size; moreover, colors of the four sub-pixels in each pixel unit are different from each other; colors of two adjacent sub-pixels in any two adjacent pixel units are same. The above pixel structure provided by embodiments of the present disclosure may enable the color of any sub-pixel in a pixel unit to be same as the colors of three sub-pixels that are located in other three pixel units adjacent to this pixel unit respectively and are symmetric with this sub-pixel relative to a same point.

Therefore, one mask plate opening can be used to evaporate the organic light emitting material of four sub-pixels of the same color simultaneously. In this way, not only the processing difficulty of the mask plate evaporation opening and the manufacturing process requirement of the display panel can be reduced so as to improve product yield, but also the resolution of the display panel can be increased.

BRIEF DESCRIPTION OF THE DRAWINGS

FIG. 1 is a schematic view of a pixel structure in the prior art;

FIG. 2a is schematic view one of a pixel structure provided by embodiments of the present disclosure;

FIG. 2b is schematic view two of a pixel structure provided by embodiments of the present disclosure;

FIG. 2c is schematic view three of a pixel structure provided by embodiments of the present disclosure;

Figures 3B, 4A:
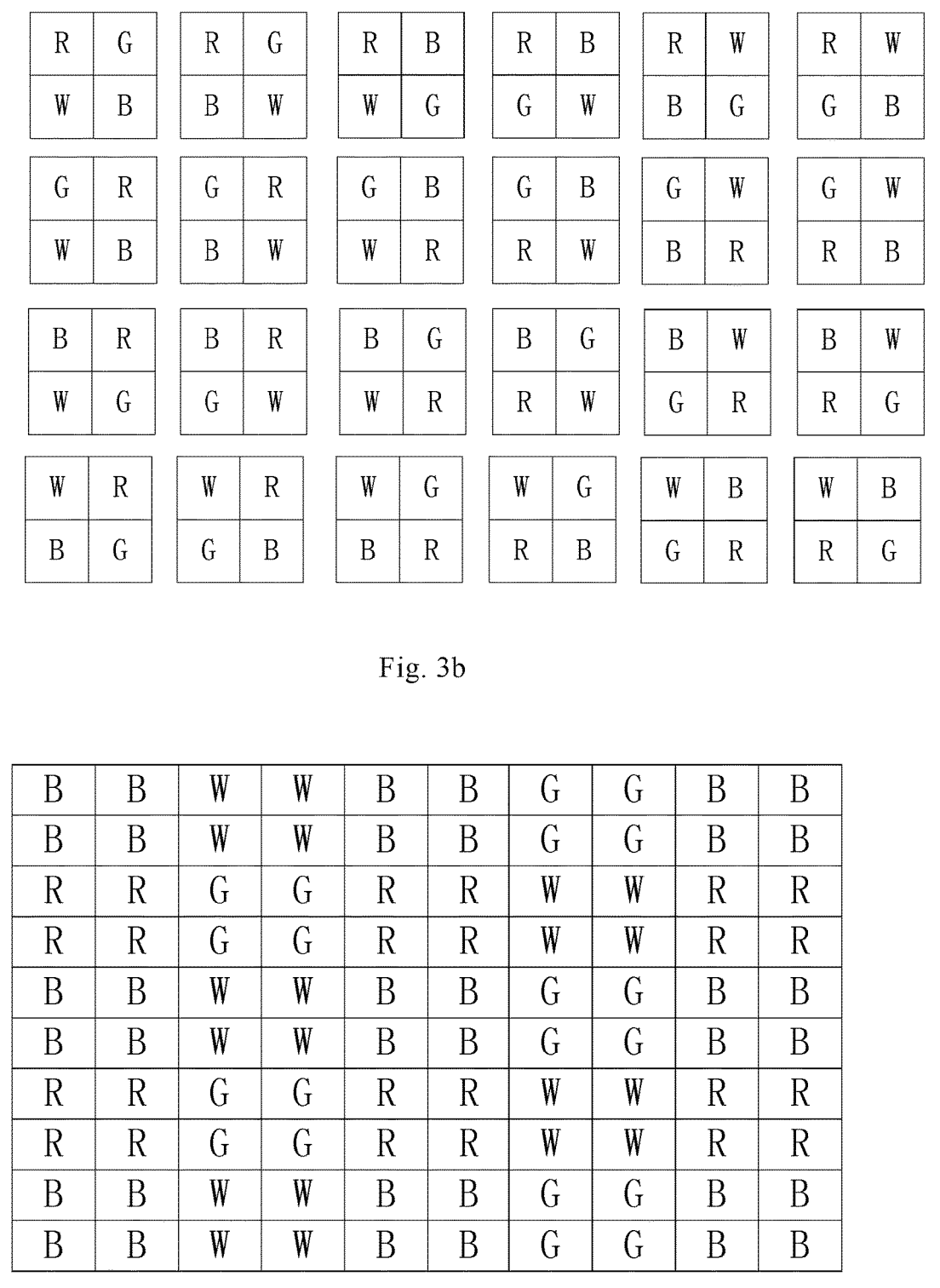

FIGS. 3a and 3b are schematic views of sub-pixels in different arrangement manners in a pixel unit provided by embodiments of the present disclosure respectively;

FIG. 4a is schematic view four of a pixel structure provided by embodiments of the present disclosure;

FIGS. 5a to 5c are schematic views of arrangement of mask plate evaporation openings provided by embodiments of the present disclosure respectively.

DETAILED DESCRIPTION

Figure 4B:
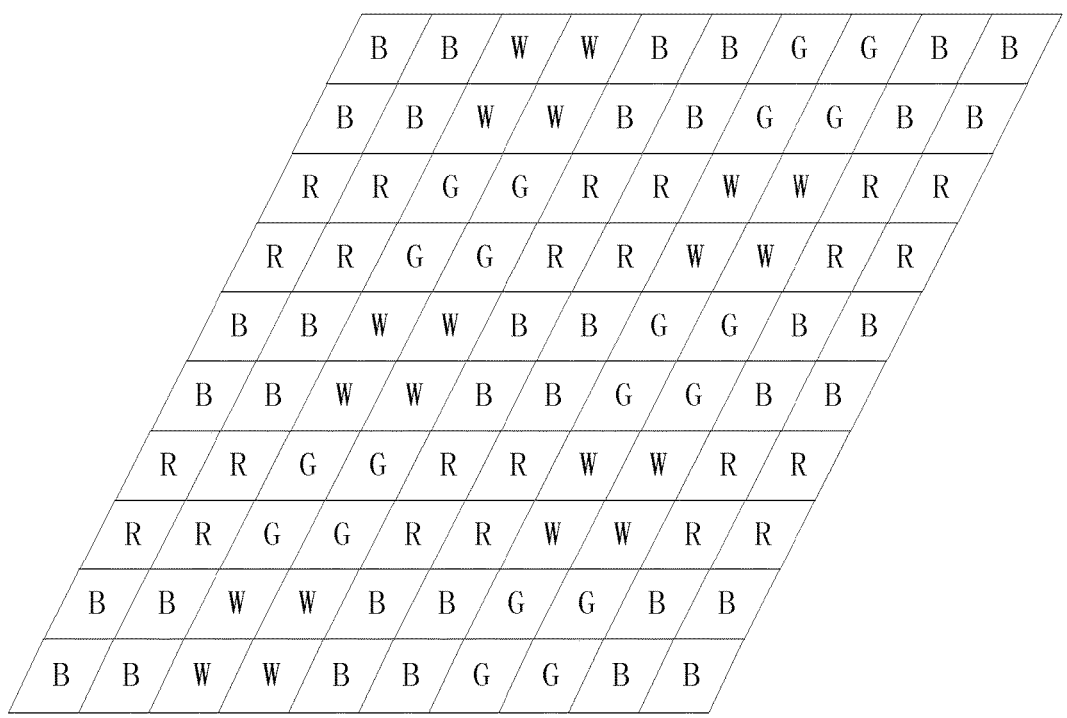
FIG. 4b is schematic view five of a pixel structure provided by embodiments of the present disclosure.

Next, the specific implementations of the pixel structure, the mask plate, the organic electroluminescent display panel and the display device provided by embodiments of the present disclosure will be explained in detail in conjunction with the drawings.

The shape and the size of the respective structures in the drawings do not reflect the real proportion of the pixel structure, which only aim to explain the content of the disclosure schematically. It should be noted that the embodiments and the features in the embodiments of the present disclosure can be combined with each other in the case of not conflicting.

Figures 2C, 3A:
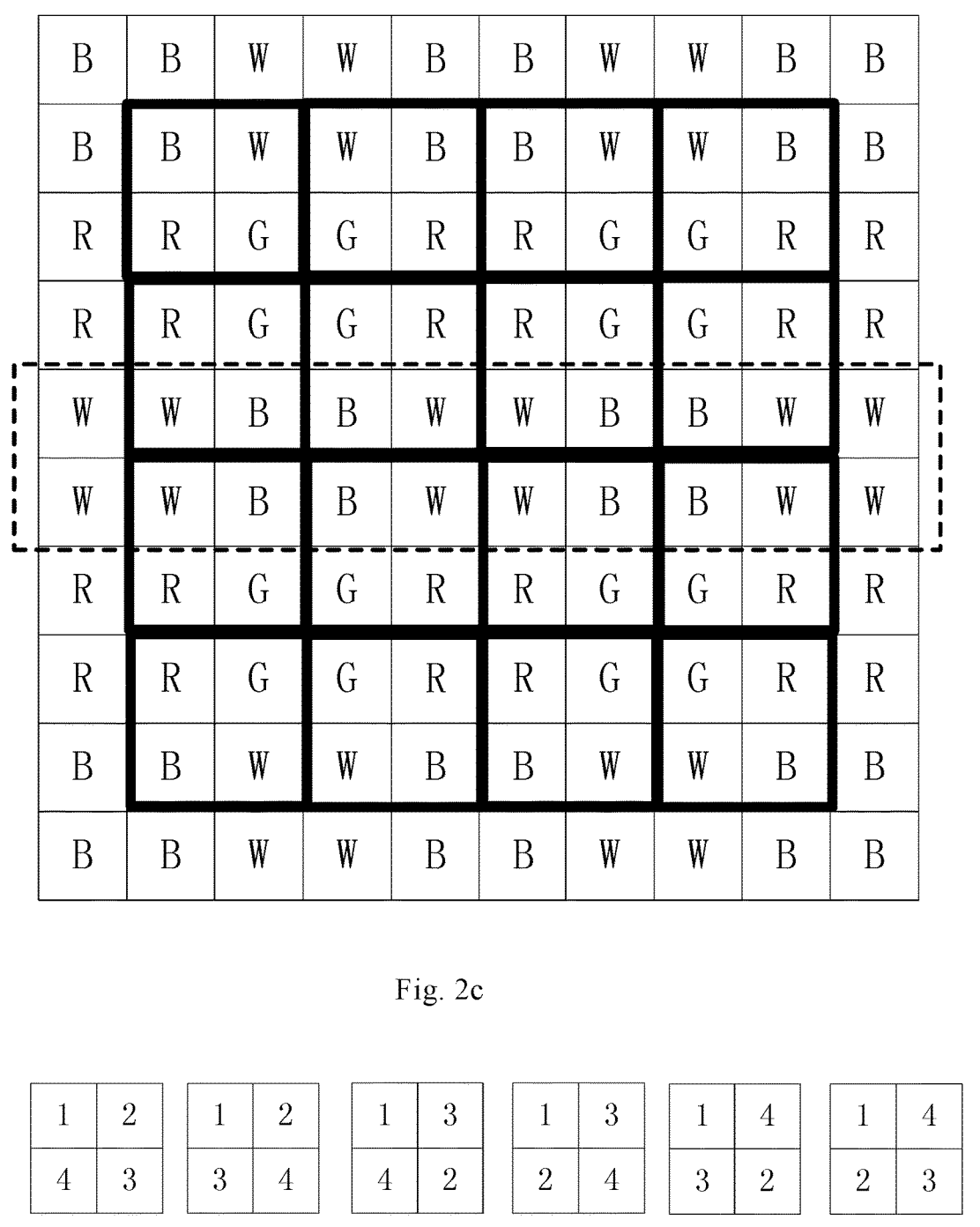

Embodiments of the present disclosure provide a pixel structure, as shown in FIG. 2a to FIG. 2c. The pixel structure comprises a plurality of pixel units arranged in array (indicated by solid blocks in FIG. 2a to FIG. 2c), each pixel unit comprising four sub-pixels arranged diagonally and having the same shape and size (taking the structure of the Chinese character "田" as an example in FIG. 2a to FIG. 2c). Colors of the four sub-pixels in each pixel unit are different from each other (e.g., the colors of the four sub-pixels are red R, blue B, green G, white W respectively in FIG. 2a to FIG. 2c), and colors of two adjacent sub-pixels in any two adjacent pixel units are same (indicated by the dashed blocks in FIG. 2a). Specifically, it should be noted that the "two adjacent sub-pixels" as mentioned herein includes two vertically adjacent sub-pixels or two horizontally adjacent sub-pixels, and the two sub-pixels are located in two adjacent pixel units respectively. The sub-pixels as shown by the dashed blocks are only examples. The "two adjacent sub-pixels" are not limited to the sub-pixels indicated by the dashed blocks. The dashed blocks in FIG. 2a only schematically mark out two pairs of adjacent sub-pixels, a pair of W sub-pixels and a pair of R sub-pixels, other two adjacent sub-pixels located in two adjacent pixel units also have to be of the same color.

It should be noted that the sub-pixels used in the pixel structure provided by embodiments of the present disclosure can be of any appropriate shapes and colors, while being not limited to the shapes and colors of the sub-pixels as shown in FIG. 2a to FIG. 2c. In addition to the pixel structures as shown in FIG. 2a to FIG. 2c, other pixel structures can also be used, as long as the colors of four sub-pixels arranged diagonally in the same pixel unit are different from each other and the colors of two adjacent sub-pixels in any two adjacent pixel units are same. It can be set based on actual conditions in specific implementations, which will not be repeated here.

The above pixel structure provided by embodiments of the present disclosure may enable the color of any sub-pixel in a pixel unit to be same as the colors of three sub-pixels that are located in other three pixel units adjacent to this pixel unit respectively and are symmetric with this sub-pixel relative to a same point. Take the solid blocks in FIG. 2a as an example, the G sub-pixel in the pixel unit of the first row and the first column, the G sub-pixel in the pixel unit of the first row and the second column, the G sub-pixel in the pixel unit of the second row and the first column and the G sub-pixel in the pixel unit of the second row and the second column have the same color. Therefore, one mask plate opening can be used to evaporate the organic light emitting material for four G sub-pixels simultaneously. In this way, not only the processing difficulty of the mask plate evaporation opening and the manufacturing process requirement of the display panel can be reduced so as to improve product yield, but also the resolution of the display panel can be increased.

In specific implementation, in the above pixel structure provided by embodiments of the present disclosure, the four sub-pixels in each pixel unit are respectively a first sub-pixel of a first color, a second sub-pixel of a second color, a third sub-pixel of a third color, and a fourth sub-pixel of a fourth color. The first color, the second color, the third color and the fourth color are mutually different colors. The first sub-pixel, the second sub-pixel, the third sub-pixel and the fourth sub-pixel are arranged in a clockwise direction or a counter-clockwise direction in one of the following arrangement manners, as shown in FIG. 3a:

the first sub-pixel, the second sub-pixel, the third sub-pixel and the fourth sub-pixel;

the first sub-pixel, the second sub-pixel, the fourth sub-pixel and the third sub-pixel;

the first sub-pixel, the third sub-pixel, the second sub-pixel and the fourth sub-pixel;

the first sub-pixel, the third sub-pixel, the fourth sub-pixel and the second sub-pixel;

the first sub-pixel, the fourth sub-pixel, the second sub-pixel and the is third sub-pixel;

the first sub-pixel, the fourth sub-pixel, the third sub-pixel and the second sub-pixel.

In specific implementation, assuming that the first sub-pixel is a B sub-pixel, the second sub-pixel is a W sub-pixel, the third sub-pixel is a G sub-pixel, and the fourth sub-pixel is a R sub-pixel, two arrangements in the clockwise direction can be found in FIG. 2a: B sub-pixel, W sub-pixel, G sub-pixel and R sub-pixel; and B sub-pixel, G sub-pixel, W sub-pixel and R sub-pixel; one arrangement in the clockwise direction can be found in FIG. 2b: B sub-pixel, W sub-pixel, G sub-pixel and R sub-pixel. Assuming that the first sub-pixel is a R sub-pixel, the second sub-pixel is a G sub-pixel, the third sub-pixel is a W sub-pixel and the fourth sub-pixel is a B sub-pixel, one arrangement in the clockwise direction can be found in FIG. 2b: R sub-pixel, G sub-pixel, W sub-pixel and B sub-pixel; two arrangements in the clockwise direction can be found in FIG. 2c: R sub-pixel, G sub-pixel, B sub-pixel and W sub-pixel; and, R sub-pixel, G sub-pixel, W sub-pixel and B sub-pixel.

It should be noted that there may be various arrangement manners for the four sub-pixels of different colors in each pixel unit. The pixel structures as shown in FIG. 2a to FIG. 2c are different just because the arrangement manners of some sub-pixels are different. Comparing FIG. 2b with FIG. 2a, the dashed block in FIG. 2b marks out the difference between FIG. 2b and FIG. 2a. For example, the arrangement of the sub-pixels in the pixel unit of the first row and the third column in the clockwise direction in FIG. 2a is B sub-pixel, G sub-pixel, W sub-pixel and R sub-pixel, while the arrangement of the sub-pixels in the pixel unit of the first row and the third pixel unit in the clockwise direction in FIG. 2b is B sub-pixel, W sub-pixel, G sub-pixel and R sub-pixel. Comparing FIG. 2c with FIG. 2b, the dashed block in FIG. 2c marks out the difference between FIG. 2c and FIG. 2b. For example, the arrangement of the sub-pixels in the pixel unit of the second row and the first column in the clockwise direction in FIG. 2b is R sub-pixel, G sub-pixel, W sub-pixel and B sub-pixel, while the arrangement of the sub-pixels in the pixel unit of the second row and the first column in the clockwise direction in FIG. 2c is R sub-pixel, G sub-pixel, B sub-pixel and W sub-pixel. In specific implementation, the sub-pixels can be arranged in different arrangement manners, as long as the sub-pixels of the four colors are distributed uniformly and the effect of displaying images are ensured. The specific arrangement manners may be determined based on specific conditions, which will not be defined here.

In specific implementation, in the above pixel structure provided by embodiments of the present disclosure, in order to improve the brightness and the colour gamut of the display panel effectively, each of the first color, the second color, the third color and the fourth color can be a color selected from red R, green G, blue B and white W, and the first color, the second color, the third color and the fourth color are different from each other. That is, the first color, the second color, the third color and the fourth color respectively may correspond to R, G, B, W, or correspond to R, G, W, B, or corresponds to R, B, G, W, or correspond to R, B, W, G, or correspond to R, W, B, G, or correspond to R, W, G, B, or correspond to G, R, B, W, or correspond to G, R, W, B, or correspond to G, B, R, W, or correspond to G, B, W, R, or correspond to G, W, B, R, or correspond to G, W, R, B, or correspond to B, R, G, W, or corresponds to B, R, W, G, or correspond to B, G, R, W, or correspond to B, G, W, R, or correspond to B, W, R, G, or correspond to B, W, G, R, or correspond to W, R, G, B, or correspond to W, R, B, G, or correspond to W, G, R, B, or correspond to W, G, B, R, or correspond to W, B, G, R, or correspond to W, B, R, G. It can be seen that the first color, the second color, the third color and the fourth color, in addition to being corresponding to R, G, B, W respectively, can also correspond to other arrangement manners of the four colors of RGBW. As shown in FIG. 3b, there are totally 24 arrangement manners of the sub-pixels in each pixel unit.

In specific implementation, in the above pixel structure provided by embodiments of the present disclosure, the shape of the sub-pixel may be one of square, rectangle and diamond. As shown in FIGS. 2a to 2c, the shape of each sub-pixel can be square; as shown in FIG. 4a, the shape of each sub-pixel can be rectangle; as shown in FIG. 4b, the shape of each sub-pixel can be diamond. It should be noted that the shape of the sub-pixel provided by embodiments of the present disclosure is not limited to those as shown in the drawings of the disclosure. The shape of the sub-pixel can be set based on actual conditions, which will not be defined here.

Based on the same inventive concept, embodiments of the present disclosure further provide an organic electroluminescent display panel, comprising the above pixel structure provided by embodiments of the present disclosure. Because the pixel structure can at least perform displaying with pixels of four colors, the organic electroluminescent display panel has the particular advantages of long lifetime, low power consumption, high brightness, high colour gamut etc.

Based on the same inventive concept, embodiments of the present disclosure further provide a mask plate for performing evaporation process to the light emitting layer of the organic electroluminescent display panel. As shown in FIG. 5a, the mask plate comprises a mask plate body and a plurality of evaporation openings arranged on the mask plate body. The plurality of evaporation openings are in aligned arrangement and each evaporation opening corresponds to a pattern constituted by sub-pixels of the same color in the pixel structure provided by embodiments of the present disclosure. For example, FIG. 5a corresponds to the pixel structure of FIG. 2a. FIG. 5a shows that the respective evaporation openings are in aligned arrangement in the row direction and the column direction and each evaporation opening corresponds to a pattern constituted by B sub-pixels (the solid blocks in FIG. 5a are patterns corresponding to the evaporation openings). Specifically, in the evaporation process, the evaporation can be performed by such mask plate as long as the evaporation openings thereof are in one-to-one correspondence with the patterns constituted by sub-pixels of the same color in the above pixel structure. An organic light emitting material that forms sub-pixels of a color can be evaporated by means of this mask plate.

Figure 5C:
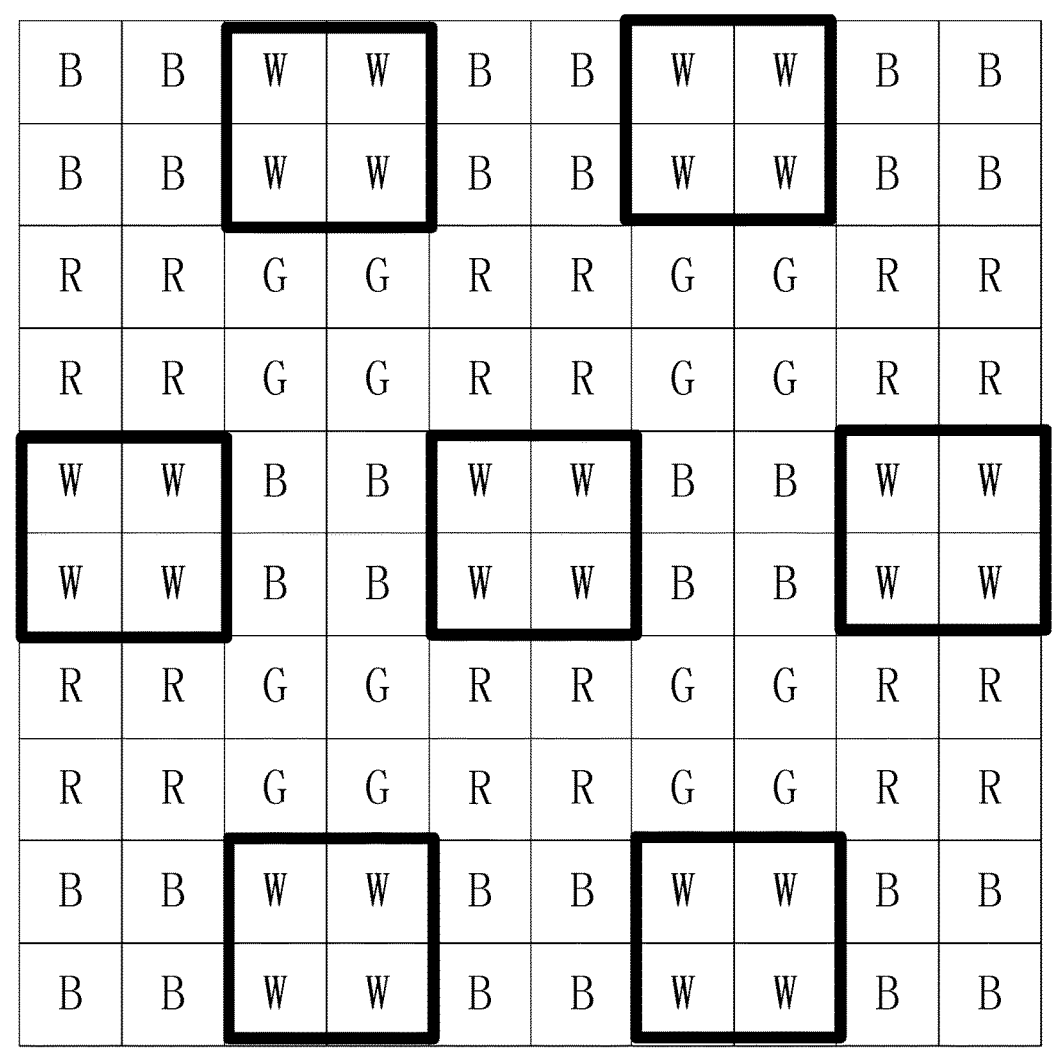

Based on the same inventive concept, embodiments of the present disclosure further provide a mask plate for performing evaporation process to the light emitting layer of the organic electroluminescent display panel. As shown in FIGS. 5b and 5c, the mask plate comprises a mask plate body and a plurality of evaporation openings arranged on the mask plate body. The plurality of evaporation openings are in staggered arrangement and each evaporation opening corresponds to a pattern constituted by sub-pixels of the same color in the pixel structure provided by embodiments of the present disclosure. For example, FIG. 5b corresponds to the pixel structure of FIG. 2a, which shows that the plurality of evaporation openings are in staggered arrangement by one pixel unit in the column direction and correspond to patterns constituted by G sub-pixels (the solid blocks in FIG. 5b are patterns corresponding to the evaporation openings). FIG. 5c corresponds to the pixel structure of FIG. 2c, which shows that the plurality of evaporation openings are in staggered arrangement by one pixel unit in the row direction and correspond to patterns constituted by W sub-pixels (the solid blocks in FIG. 5c are patterns corresponding to the evaporation openings). Specifically, in the evaporation process, the evaporation can be performed by the mask plate as long as the evaporation openings thereof are in one-to-one correspondence with the patterns constituted by sub-pixels of the same color in the above pixel structure. An organic light emitting material that forms sub-pixels of a color can be evaporated by means of this mask plate.

It should be noted that the evaporation opening of the mask can be set as square, rectangle or diamond, which is dependent on the shape of the sub-pixel in the pixel structure, and will not be repeated here. Evaporation can be performed to all square, rectangle or diamond areas constituted by sub-pixels with the same organic light emitting material. In this process, because one evaporation opening corresponds to four sub-pixels, the manufacturing difficulty of the evaporation openings of the mask plate is reduced, i.e., the evaporation openings can be made relatively large.

Based on the same inventive concept, embodiments of the present disclosure further provide a display device, comprising the above organic electroluminescent display panel provided by embodiments of the present disclosure. The display device can be any product or component with the display function such as a mobile phone, a panel computer, a television, a display, a laptop, a digital photo frame, a navigator etc. Other indispensable composite parts of the display device are all known by the ordinary skilled person in the art, which will not be repeated here, nor should be taken as limitations to the present disclosure. The implementation of the display device may refer to the above embodiments of the organic electroluminescent display panel and the pixel structure, which will not be repeated here.

In the pixel structure, the mask plate, the organic electroluminescent display panel and the display device provided by embodiments of the present disclosure, the pixel structure comprises a plurality of pixel units arranged in array, each pixel unit comprising four sub-pixels arranged diagonally and having the same shape and size; moreover, colors of the four sub-pixels in each pixel unit are different from each other; colors of two adjacent sub-pixels in any two adjacent pixel units are same. The above pixel structure provided by embodiments of the present disclosure may enable the color of any sub-pixel in a pixel unit to be same as the colors of three sub-pixels that are located in other three pixel units adjacent to this pixel unit respectively and are symmetric with this sub-pixel relative to a same point. Therefore, one mask plate opening can be used to evaporate the organic light emitting material of four sub-pixels of the same color simultaneously. In this way, not only the processing difficulty of the mask plate evaporation opening and the manufacturing process requirement of the display panel can be reduced so as to improve product yield, but also the resolution of the display panel can be increased.

Apparently, the skilled person in the art can make various amendments and modifications to the disclosure without departing from the spirit and the scope of the present disclosure. In this way, provided that these amendments and modifications of the disclosure belong to the scopes of the claims of the present disclosure and the equivalent technologies thereof, the present disclosure also intends to encompass these amendments and modifications.

The invention claimed is:

1. A pixel structure, comprising: a plurality of pixel units arranged in array, each pixel unit comprising four sub-pixels arranged diagonally and having the same shape and size; wherein, colors of the four sub-pixels in each pixel unit are different from each other;
two sub-pixels, being in two adjacent pixel units respectively and bordering on each other directly, are of a same color; and
the pixel unit located at the $i^{th}$ row and the $j^{th}$ column has a color distribution of sub-pixels different from that of the pixel unit located at the $(i+2)^{th}$ row and the $j^{th}$ column or that of the pixel unit located at the $i^{th}$ row and the $(j+2)^{th}$ column, wherein i and j are both integers larger than zero.

2. The pixel structure as claimed in claim 1, wherein the four sub-pixels in each pixel unit are respectively a first sub-pixel of a first color, a second sub-pixel of a second color, a third sub-pixel of a third color, and a fourth sub-pixel of a fourth color, and wherein the first sub-pixel, the second sub-pixel, the third sub-pixel and the fourth sub-pixel are arranged in a clockwise direction or a counter-clockwise direction in one of the following arrangement manners:
the first sub-pixel, the second sub-pixel, the third sub-pixel and the fourth sub-pixel;
the first sub-pixel, the second sub-pixel, the fourth sub-pixel and the third sub-pixel;
the first sub-pixel, the third sub-pixel, the second sub-pixel and the fourth sub-pixel;
the first sub-pixel, the third sub-pixel, the fourth sub-pixel and the second sub-pixel;
the first sub-pixel, the fourth sub-pixel, the second sub-pixel and the third sub-pixel;
the first sub-pixel, the fourth sub-pixel, the third sub-pixel and the second sub-pixel.

3. The pixel structure as claimed in claim 2, wherein each of the first color, the second color, the third color and the fourth color is a color selected from red, green, blue and white and the first color, the second color, the third color and the fourth color are different from each other.

4. A mask plate, comprising: a mask plate body and a plurality of evaporation openings arranged on the mask plate body, wherein the plurality of evaporation openings are in aligned arrangement and each evaporation opening corresponds to a pattern constituted by sub-pixels of the same color in the pixel structure as claimed in claim 3.

5. A mask plate, comprising: a mask plate body and a plurality of evaporation openings arranged on the mask plate body, wherein the plurality of evaporation openings are in staggered arrangement and each evaporation opening corresponds to a pattern constituted by sub-pixels of the same color in the pixel structure as claimed in claim 3.

6. An organic electroluminescent display panel, comprising the pixel structure as claimed in claim 3.

7. A display device, comprising the organic electroluminescent display panel as claimed in claim 6.

8. A mask plate, comprising: a mask plate body and a plurality of evaporation openings arranged on the mask plate body, wherein the plurality of evaporation openings are in aligned arrangement and each evaporation opening corresponds to a pattern constituted by sub-pixels of the same color in the pixel structure as claimed in claim 2.

9. A mask plate, comprising: a mask plate body and a plurality of evaporation openings arranged on the mask plate body, wherein the plurality of evaporation openings are in staggered arrangement and each evaporation opening corresponds to a pattern constituted by sub-pixels of the same color in the pixel structure as claimed in claim 2.

10. An organic electroluminescent display panel, comprising the pixel structure as claimed in claim 2.

11. A display device, comprising the organic electroluminescent display panel as claimed in claim 10.

12. The pixel structure as claimed in claim 1, wherein the shape of the sub-pixel is one of square, rectangle and diamond.

13. A mask plate, comprising: a mask plate body and a plurality of evaporation openings arranged on the mask plate body, wherein the plurality of evaporation openings are in aligned arrangement and each evaporation opening corresponds to a pattern constituted by sub-pixels of the same color in the pixel structure as claimed in claim 12.

14. A mask plate, comprising: a mask plate body and a plurality of evaporation openings arranged on the mask plate body, wherein the plurality of evaporation openings are in staggered arrangement and each evaporation opening corresponds to a pattern constituted by sub-pixels of the same color in the pixel structure as claimed in claim 12.

15. An organic electroluminescent display panel, comprising the pixel structure as claimed in claim 12.

16. A display device, comprising the organic electroluminescent display panel as claimed in claim 15.

17. A mask plate, comprising: a mask plate body and a plurality of evaporation openings arranged on the mask plate body, wherein the plurality of evaporation openings are in aligned arrangement and each evaporation opening corresponds to a pattern constituted by sub-pixels of the same color in the pixel structure as claimed in claim 1.

18. A mask plate, comprising: a mask plate body and a plurality of evaporation openings arranged on the mask plate body, wherein the plurality of evaporation openings are in staggered arrangement and each evaporation opening corresponds to a pattern constituted by sub-pixels of the same color in the pixel structure as claimed in claim 1.

19. An organic electroluminescent display panel, comprising the pixel structure as claimed in claim 1.

20. A display device, comprising the organic electroluminescent display panel as claimed in claim 19.

* * * * *